United States Patent
Bulu et al.

(10) Patent No.: US 9,771,789 B2
(45) Date of Patent: Sep. 26, 2017

(54) ASYMMETRIC EXCLUDER FOR DOWNHOLE LOGGING TOOL

(71) Applicant: Schlumberger Technology Corporation, Sugar Land, TX (US)

(72) Inventors: Irfan Bulu, Somerville, MA (US); Yi-Qiao Song, Newton Center, MA (US); Jagdish Shah, Cheshire, CT (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 382 days.

(21) Appl. No.: 14/470,318

(22) Filed: Aug. 27, 2014

(65) Prior Publication Data

US 2015/0292316 A1 Oct. 15, 2015

Related U.S. Application Data

(60) Provisional application No. 61/978,784, filed on Apr. 11, 2014.

(51) Int. Cl.
  *E21B 47/022* (2012.01)
  *G01R 33/38* (2006.01)

(52) U.S. Cl.
  CPC .... *E21B 47/02216* (2013.01); *G01R 33/3808* (2013.01)

(58) Field of Classification Search
  CPC .... E21B 47/02216; E21B 47/01; E21B 47/00; E21B 49/00; E21B 47/011; G01R 33/3808; G01R 33/20; G01R 33/44; G01V 3/00; G01V 3/32; G01V 3/18; G01V 3/36; G09K 5/063; G01N 24/081
  See application file for complete search history.

(56) References Cited

U.S. PATENT DOCUMENTS

| | | | |
|---|---|---|---|
| 5,432,446 A | 7/1995 | MacInnis et al. | |
| 6,229,308 B1 | 5/2001 | Freedman | |
| 6,489,763 B1 | 12/2002 | Goswami et al. | |
| 6,956,372 B2 * | 10/2005 | Masak | G01V 3/32 324/303 |
| 2003/0001568 A1 | 1/2003 | Edwards et al. | |
| 2009/0128144 A1 | 5/2009 | Freedman et al. | |
| 2011/0042075 A1 | 2/2011 | Hammami et al. | |

OTHER PUBLICATIONS

Akkurt, et al., "NMR Logging of Natural Gas Reservoirs", The Log Analyst, vol. 37, No. 6, 1996, pp. 33-42.
International Search Report for corresponding International App No. PCT/US2015/025336, Jul. 15, 2015, 3 pages.
Written Opinion for corresponding International App No. PCT/US2015/025336, Jul. 15, 2015, 8 pages.
International Preliminary Report on patentability issued in the related PCT application PCT/US2015/025336, dated Oct. 12, 2016 (9 pages).
Hermann A. Haus, James R. Melcher, Electromagnetic Fields and Energy, Prentice Hall, 1989, (53 pages).

* cited by examiner

*Primary Examiner* — Wei Wang
(74) *Attorney, Agent, or Firm* — Michael Dae

(57) ABSTRACT

A downhole tool includes a cylindrical housing. A magnet and an antenna may be positioned within the housing. An excluder may be positioned around the housing, and a thickness of the excluder may vary around the housing.

15 Claims, 4 Drawing Sheets

ASYMMETRIC EXCLUDER FOR DOWNHOLE LOGGING TOOL

CROSS-REFERENCE TO RELATED APPLICATIONS

This application claims the benefit of a related U.S. Provisional Patent Application having Ser. No. 61/978,784 filed on Apr. 11, 2014, entitled "Asymmetric Excluder for Downhole Logging Tool," the disclosure of which is incorporated by reference herein in its entirety.

BACKGROUND

Technical Field

The present disclosure relates generally to the field of downhole logging tools and, more particularly, to an excluder for a nuclear magnetic resonance logging tool.

Background Information

This section is intended to introduce the reader to various aspects of art that may be related to various aspects of the subject matter described and/or claimed below. This discussion is believed to be helpful in providing the reader with background information to facilitate a better understanding of the various aspects of the present disclosure. Accordingly, it should be understood that these statements are to be read in this light, not as admissions of prior art.

Logging tools have long been used in wellbores to make, for example, formation evaluation measurements that support inferring properties of the formations surrounding the wellbore and the fluids in the formations. Common logging tools include electromagnetic (resistivity) tools, nuclear tools, acoustic tools, and nuclear magnetic resonance (NMR) tools, though various other types of tools for evaluating formation properties are also available.

Some conventional NMR tools include an antenna that emits a radio frequency (RF) magnetic field from a first or "front" side of the antenna. One concern with such tools in oilfield applications is their performance in wellbores containing high-salinity, conductive fluid (e.g., mud). The conductive mud appears as an additional resistive load ($R_{mud}$) due to eddy currents being generated in the conductive mud when the magnetic field is applied. The power absorbed due to the eddy currents may be evaluated using the equation below:

$$P_{abs} = \int J \cdot E dv$$

where $P_{abs}$ represents the power absorbed, J represents the current induced in the mud, and E represents the electric field. The additional load due to the mud may be expressed by:

$$P_{abs} = \frac{1}{2} R I^2$$

where R represents the resistive load, and I represents current. It has been observed that this loss may also cause an additional Johnson-Nyquist noise due to thermal fluctuations in the mud that are proportional to the square root of $R_{mud}$.

The antenna of the NMR tool is positioned within a hollow, cylindrical sleeve (referred to as an excluder). The majority of the power absorbed is by the mud that is positioned between the front side of the antenna and the wellbore wall. The excluder may be placed in contact with the wellbore wall to reduce the amount of mud between the antenna and the wellbore wall, and thus the amount of power lost. However, because the excluder has a smaller diameter than the wellbore wall, any contact between the excluder and the wellbore wall is along a linear (e.g., vertical) contact line. Thus, the distance between the excluder and the wellbore wall, and the amount of mud between the excluder and the wellbore wall, increases moving circumferentially away from this linear contact line.

SUMMARY

A summary of certain embodiments disclosed herein is set forth below. It should be understood that these aspects are presented merely to provide the reader with a brief summary of certain embodiments and that these aspects are not intended to limit the scope of this disclosure. Indeed, this disclosure may encompass a variety of aspects that may not be set forth in this section.

A downhole tool is disclosed. The downhole tool may include a cylindrical housing. A magnet and an antenna may be positioned within the housing. An excluder may be positioned around the housing, and a thickness of the excluder may vary around the housing.

In another embodiment, the downhole tool may include a housing. A magnet and an antenna may be positioned within the housing. An excluder may be positioned around the housing. A distance between a central longitudinal axis of the housing and an outer surface of the excluder may be less at a first angle than at a second angle. The first and second angles may be measured with respect to an axis that extends from the central longitudinal axis through a center of the antenna.

A method for measuring properties of a formation surrounding a wellbore is also disclosed. The method may include running a downhole tool into the wellbore. The downhole tool may include a substantially cylindrical housing. A magnet and an antenna may be positioned within the housing. An excluder may be positioned around the housing. A thickness of the excluder may vary around the housing. The downhole tool may be positioned such that an outer surface of the excluder is in contact with a wall of the wellbore.

The brief summary presented above is intended to familiarize the reader with certain aspects and contexts of embodiments of the present disclosure without limitation to the claimed subject matter.

BRIEF DESCRIPTION OF THE DRAWINGS

Other aspects and advantages of the invention will become apparent upon reading the following detailed description and upon reference to the drawings in which:

FIG. 6-1 depicts a first embodiment (A) of the downhole tool without the excluder. FIG. 6-2 depicts a second embodiment (B) of the downhole tool with the excluder where the excluder is not contacting the wall of the wellbore. FIG. 6-3 depicts a third embodiment (C) of the downhole tool with the excluder where the excluder is in contact with the wall of the wellbore. FIG. 6-4 depicts an illustrative graph showing the measured electrical resistance for the embodiments A, B, and C.

DETAILED DESCRIPTION

Figure 1:
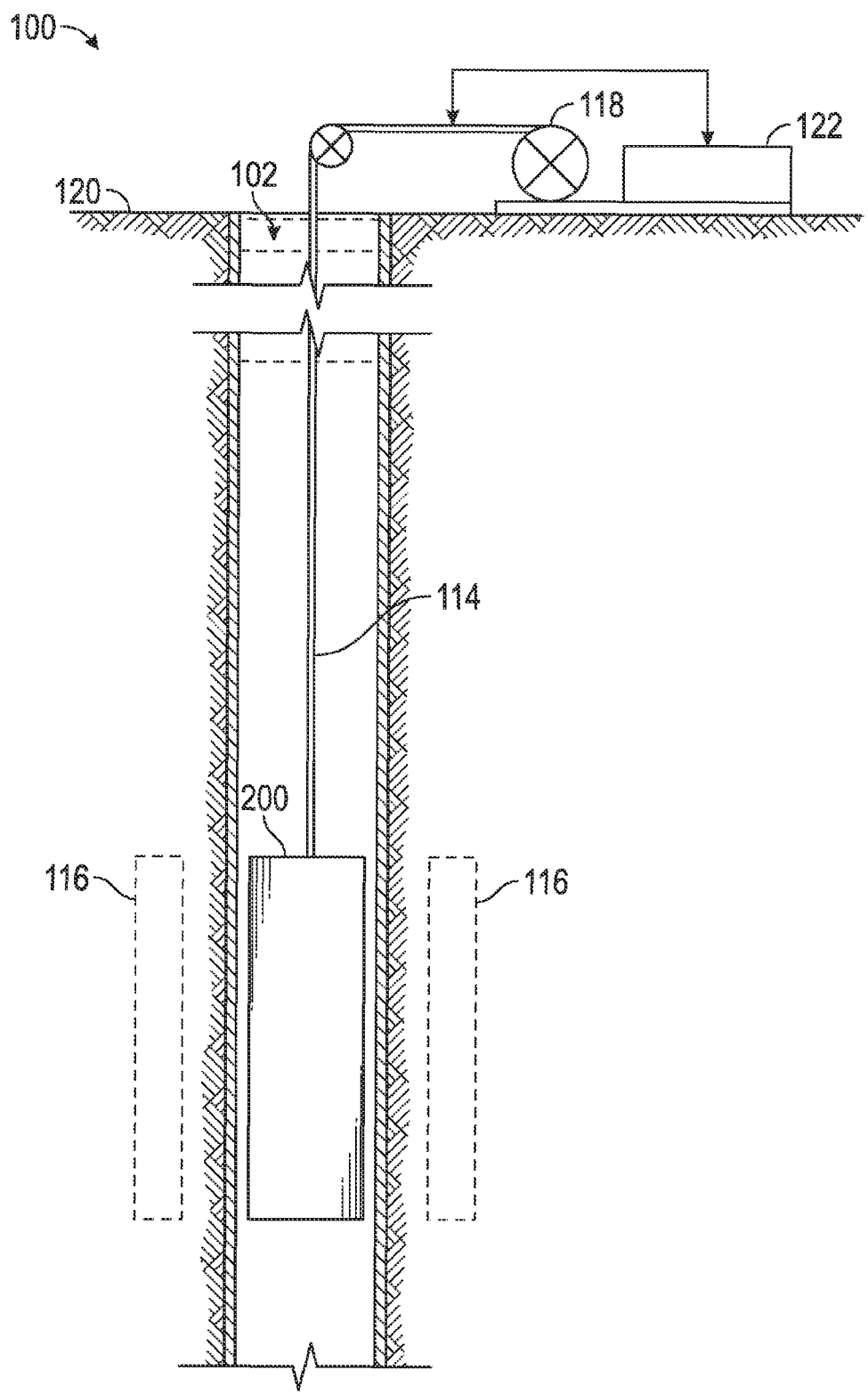
FIG. 1 depicts a schematic, cross-sectional view of a well logging system, according to one or more embodiments disclosed.

One or more specific embodiments of the present disclosure are described below. These embodiments are merely examples of the presently disclosed techniques. Additionally, in an effort to provide a concise description of these embodiments, all features of an actual implementation may not be described in the specification. It should be appreciated that in the development of any such implementation, as in any engineering or design project, numerous implementation-specific decisions are made to achieve the developers' specific goals, such as compliance with system-related and business-related constraints, which may vary from one implementation to another. Moreover, it should be appreciated that such development efforts might be complex and time consuming, but would nonetheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The embodiments discussed below are intended to be examples that are illustrative in nature and should not be construed to mean that the specific embodiments described herein are necessarily preferential in nature. Additionally, it should be understood that references to "one embodiment" or "an embodiment" within the present disclosure are not to be interpreted as excluding the existence of additional embodiments that also incorporate the recited features.

NMR logging tools may use permanent magnets to create a static magnetic polarizing field inside the surrounding formation. The hydrogen nuclei of water and hydrocarbons may be electrically-charged, spinning protons that create a weak magnetic field, similar to bar magnets. When a strong, external magnetic field from the logging tool passes through a formation containing fluids, these spinning protons may align themselves like compass needles along the magnetic field. This process, called "polarization," may increase exponentially with a time constant $T_1$, as long as the external magnetic field is applied. A magnetic pulse from the antenna of the NMR logging tool may rotate, or tip, the aligned protons into a plane perpendicular to the polarization field. These tipped protons may wobble or precess around the direction of the strong magnetic field generated by the NMR logging tool.

The precession frequency, called the Larmor frequency, may be proportional to the strength of the external magnetic field. The precessing protons may create an oscillating magnetic field, which generates weak radio signals at this frequency. The total signal amplitude from the precessing hydrogen nuclei (e.g., a few microvolts) may be a measure of the total hydrogen content, or porosity, of the formation. The rate at which the proton precession decays, called the transverse relaxation time $T_2$, may react to the environment of the fluid (e.g., the pore-size distribution). $T_2$ corresponds to the rate at which the spinning protons lose their alignment within the transverse plane. $T_2$ may depend on one or more factors such as: the intrinsic bulk-relaxation rate in the fluid; the surface-relaxation rate, which is an environmental effect; and relaxation from diffusion in a polarized field gradient, which is a combination of environmental and tool effects. There may be no diffusion contribution to the longitudinal relaxation time $T_1$. The spinning protons may quickly lose their relative phase alignment within the transverse plane because of variations in the static magnetic field. This process is called the free induction decay (FID), and the Carr-Purcell-Meiboom-Gill (CPMG) pulse-echo sequence may be used to compensate for the rapid free-induction decay caused by reversible transverse dephasing effects.

The three components of the transverse relaxation decay may play a role in the use of the $T_2$ distribution for well logging applications. For example, the intrinsic bulk relaxation decay time may be caused principally by the magnetic interactions between neighboring spinning protons in the fluid molecules. These are often called spin-spin interactions. Molecular motion in water and light oil may be rapid, so the relaxation may be inefficient with correspondingly long decay-time constants. However, as liquids become more viscous, the molecular motion may be slower. Then the magnetic fields, fluctuating due to their relative motion, may approach the Larmor precession frequency, and the spin-spin magnetic relation interactions may become more efficient. Thus, tar and viscous oils may be identified because they relax relatively efficiently with shorter $T_2$ decay times than light oil or water.

Fluids near, or in contact with, grain surfaces may relax at a higher rate than the bulk fluid relaxation rate. Because of complex atomic level electromagnetic field interactions at the grain surface, there may be a high probability that the spinning proton in the fluid will relax when it encounters a grain surface. For the surface relaxation process to dominate the decay time, the spinning protons in the fluid may make multiple encounters with the surface, caused by Brownian motion, across small pores in the formation. They may repeatedly collide with the surface until a relaxation event occurs. The resulting $T_2$ distribution leads to a natural measure of the pore-size distribution.

The approach described above comes from early generation NMR logging tools, which measured simple echo trains that solely reflected $T_2$ distributions. More recent NMR tools acquire more complex datasets that contain information about $T_2$ distributions, and also about $T_1$ and molecular diffusion rates, D. These properties, in particular molecular diffusion rates, may be highly dependent on the fluid types, as explained below.

Relaxation from diffusion in the polarization field gradient is a technique used to differentiate oil from gas. See, e.g., R. Akkurt et al., "NMR Logging of Natural Gas Reservoirs," The Log Analyst, no. 6 November-December 1996. Because the spinning protons move randomly in the fluid, any magnetic field gradients may lead to incomplete compensation with the CPMG pulse-echo sequence. For example, between spin-flipping pulses, some protons may drift, due to their Brownian motion, from one region to another of different field strength, which changes their precession rate. As a result, they may not receive the appropriate phase adjustment for their previous polarization environment. This may lead to an increase in the observed transverse dephasing relaxation rate. Gas has relatively high mobility compared with oil and water, and therefore, the spinning protons in gas may have a much larger diffusion effect.

FIG. 1 depicts a schematic cross-sectional view of a well logging system 100, according to one or more embodiments disclosed. A downhole tool 200 may be suspended in a wellbore 102 by a cable 114, and disposed proximate to an investigation area 116 about which data is to be obtained. The length of the cable 114 may be controlled by a drum and winch mechanism 118 or the like at the surface 120 to control the depth of the downhole tool 200. The cable 114 may include a communication link configured to transfer data between the downhole tool 200 and a processing system 122. The communication system may be of an electrical, mechanical or electromechanical type, and may include copper wire, fiber-optic cable, or the like.

Figure 2:
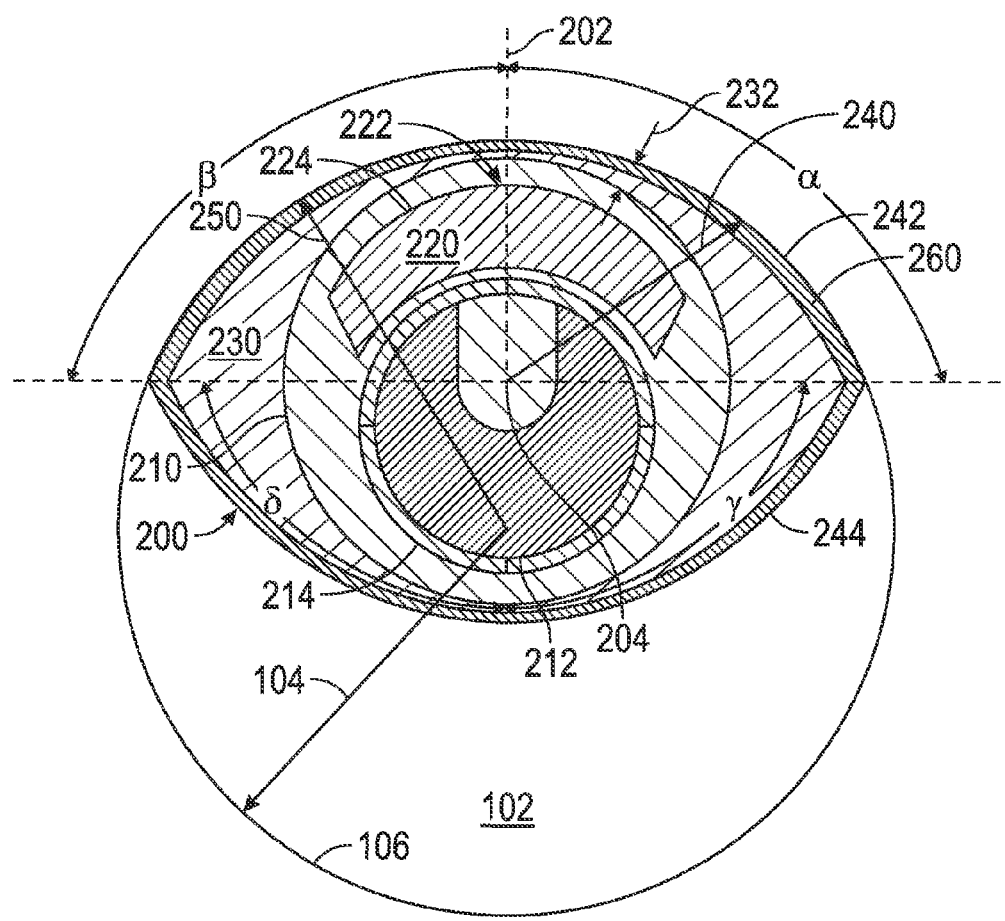
FIG. 2 depicts a cross-sectional view of a downhole tool of the well logging system in a wellbore, according to one or more embodiments disclosed.

FIG. 2 depicts a cross-sectional view of the downhole tool 200 in the wellbore 102, according to one or more embodiments disclosed. The downhole tool 200 may be used in wireline logging applications, logging-while-drilling (LWD), or measurement-while-drilling (MWD) applications. For example, the downhole tool 200 may be or include a nuclear magnetic resonance device. The downhole tool 200 may include a cylindrical body or housing 210. One or more magnets (e.g., a permanent magnet array) 212 may be positioned within the housing 210. As shown, the magnets 212 may be positioned within a metal (e.g., titanium) tube 214 that is inside the housing 212. The magnets 212 may produce a static magnetic field in the surrounding formation.

One or more radio frequency (RF) antennas 220 may also be positioned within the housing 210. The RF antennas 220 may be or include one or more coils that produce RF electromagnetic field pulses (i.e., energy) in the formation and receive and/or measure the resulting spin echoes from the formation. As an example, the downhole tool 200 may be a model of the MR SCANNER® tool available from Schlumberger Technology Corporation of Sugar Land, Tex.

A sleeve or excluder 230 may be positioned at least partially around the housing 210. In at least one embodiment, the excluder 230 may not be cylindrical (e.g., it may be asymmetrical). As shown, the excluder 230 may have the cross-sectional shape of an oval, a prolate spheroid, a football, or the like. The excluder 230 may be made of a high temperature plastic such as ULTEM® or VESPEL®. The excluder 230 may include a second layer or "cover" 260 having a thickness from about 0.1 cm to about 0.5 cm, about 0.2 cm to about 0.75 cm, or about 0.3 cm to about 1 cm. The cover 260 may be made of fiberglass.

A reference axis 202 may extend from the central longitudinal axis 204 of the downhole tool 200 and/or the housing 210 through a center 222 of the front side 224 of the antenna 220. A thickness 232 of the excluder 230 proximate to the center 222 of the front side 224 of the antenna 220 (i.e., at 0° with respect to the reference axis 202) may be from about 0.1 cm to about 1 cm, about 0.5 cm to about 2 cm, or about 1 cm to about 3 cm. The thickness 232 may be measured in a radial direction with respect to the central longitudinal axis 204 through the downhole tool 200.

The thickness 232 of the excluder 230 may vary around the circumference of the housing 210. More particularly, the thickness 232 may increase moving circumferentially-away from the center 222 of the front side 224 of the antenna 220. The thickness 232 may increase through an angle α in the clockwise direction with respect to the reference axis 202, and through an angle β in the counterclockwise direction with respect to the reference axis 202. The angle α and/or β may be from about 10° to about 120°, about 45° to about 90°, about 60° to about 90°, about 75° to about 90°, or any angle within any of these specified ranges.

In at least one embodiment, the thickness 232 of the excluder 230 may be greatest at the angle α and/or β. The thickness 232 may then decrease through an angle γ in the clockwise direction with respect to the reference axis 202, and through an angle δ in the counterclockwise direction with respect to the reference axis 202. γ may be equal to 180°-α, and δ may be equal to 180°-β.

Although not shown, in at least one embodiment, the housing 210 may not be substantially cylindrical and/or the thickness 232 of the excluder 230 may be substantially uniform around the housing 210. For example, the housing 210 may have a cross-sectional shape of an oval, a prolate spheroid, a football, or the like, and the excluder 230 may have a substantially uniform thickness 232 around the housing 210. In this instance, a distance 240 between the central longitudinal axis 204 of the downhole tool 200 (or housing 210) and an outer front surface 242 of the excluder 230 may vary through the angles α and/or β. For example, the distance 240 may increase through the angle α in the clockwise direction with respect to the reference axis 202, and the distance 240 may increase through the angle β in the counterclockwise direction with respect to the reference axis 202. The distance 240 between the central longitudinal axis 204 of the downhole tool 200 and an outer back surface 244 of the excluder 230 may also vary through the angles γ and/or δ. For example, the distance 240 may also decrease through the angle γ in the clockwise direction with respect to the reference axis 202, and through the angle δ in the counterclockwise direction with respect to the reference axis 202.

In at least one embodiment, at least a portion of the outer front surface 242 of the excluder 230 may have a substantially constant radius 250. As used herein, the term "substantially constant radius" refers to a distance that varies by less than or equal to 10% through the specified angle (e.g., α). For example, the portion of the outer front surface 242 between 0° and α may have a substantially constant radius 250, and/or the portion of the outer front surface 242 between 0° and β may have a substantially constant radius 250. As may be appreciated, in some embodiments the radius 250 may be measured from a point other than the central longitudinal axis 204 of the downhole tool 200. This radius 250 may be substantially equal to the radius 104 of the wellbore 102. As used herein, the term "substantially equal" refers to a difference between a first distance (e.g., radius 250 of the excluder 230) and a second distance (e.g., radius 104 of the wellbore 102) being less than or equal to 10%. Although not shown, one or more biasing devices (e.g., bow springs) may be coupled to the downhole tool 200 or the excluder 230 to bias the excluder 230 into contact with the wall 106 of the wellbore 102.

Figure 3:
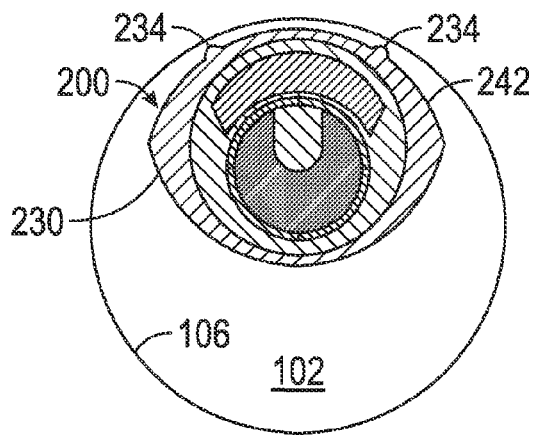
FIG. 3 depicts another cross-sectional view of the downhole tool in the wellbore, according to one or more embodiments disclosed.

FIG. 3 depicts a cross-sectional view of the downhole tool 200 within the wellbore 102, according to one or more embodiments disclosed. The excluder 230 may include one or more protrusions (two are shown) 234 extending outwardly from the outer front surface 242 (e.g., within the angle α and/or β). The protrusions 234 may extend outwardly a distance from about 0.1 cm to about 1.0 cm, about 0.5 cm to about 1.5 cm, about 1 cm to about 3 cm, or more.

Each protrusion 234 may create a point contact with the wall 106 of the wellbore 102. In another embodiment, each protrusion 234 may create a line contact with the wall 106 of the wellbore 102 that is parallel to the central longitudinal axis 204 of the downhole tool 200 and/or the wellbore 102. This may cause the remainder of the outer front surface 242 of the excluder 230 to be slightly spaced-apart from the wall 106 of the wellbore 102. While the protrusions 234 may allow more mud to be between the outer front surface 242 of the excluder 230 and the wall 106 of the wellbore 102, they may also reduce the surface area of the excluder 230 that is in contact with the wall 106 of the wellbore 102, which may thereby decrease the friction or "sticking" forces between the excluder 230 and the wall 106 of the wellbore 102. This may allow the downhole tool 200 to be moved more easily (i.e., with less force) in the wellbore 102.

Figure 4:
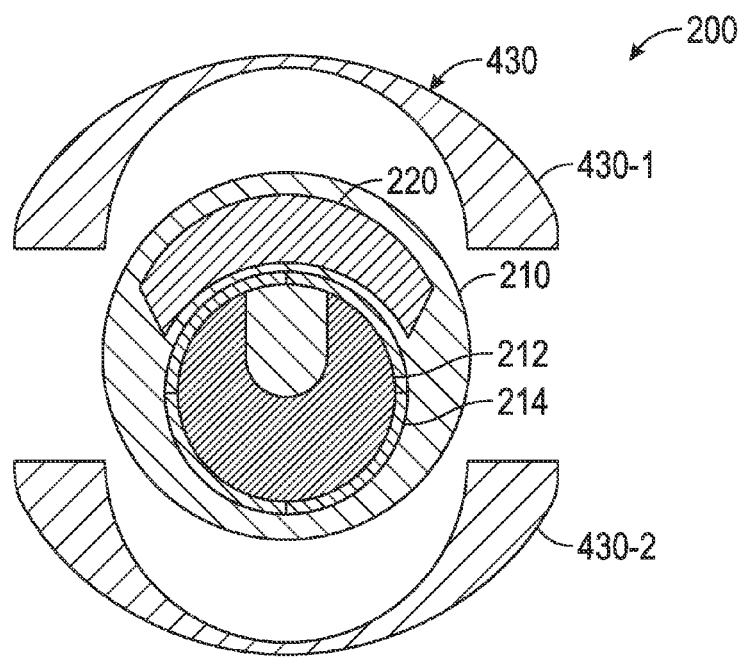
FIG. 4 depicts a cross-sectional view of the downhole tool with an illustrative two part excluder positioned thereabout, according to one or more embodiments disclosed.

FIG. 4 depicts a cross-sectional view of the downhole tool 200 with an illustrative two part excluder 430 positioned thereabout, according to one or more embodiments disclosed. As shown, the excluder 430 may include a first or "front" portion 430-1 and a second or "back" portion 430-2. The first and second portions 430-1, 430-2 of the excluder 430 may each extend around a portion of the circumference of the housing 210. For example, the first and second portions 430-1, 430-2 may each extend around about 180° of the housing 210. The first and second portions 430-1, 430-2 may be coupled together with glue, pins, anchors, clamps, fasteners, bands, or the like.

The first and second portions 430-1, 430-2 may have the same shape or be different shapes. If their shapes are the same, after the first portion 430-1 becomes worn down due to contact with the wall 106 of the wellbore 102, the first and second portions 430-1, 430-2 may be rotated to place the second portion 430-2 in contact with the wall 106 of the wellbore 102. This may increase (e.g., double) the lifetime of the excluder.

Figure 5:
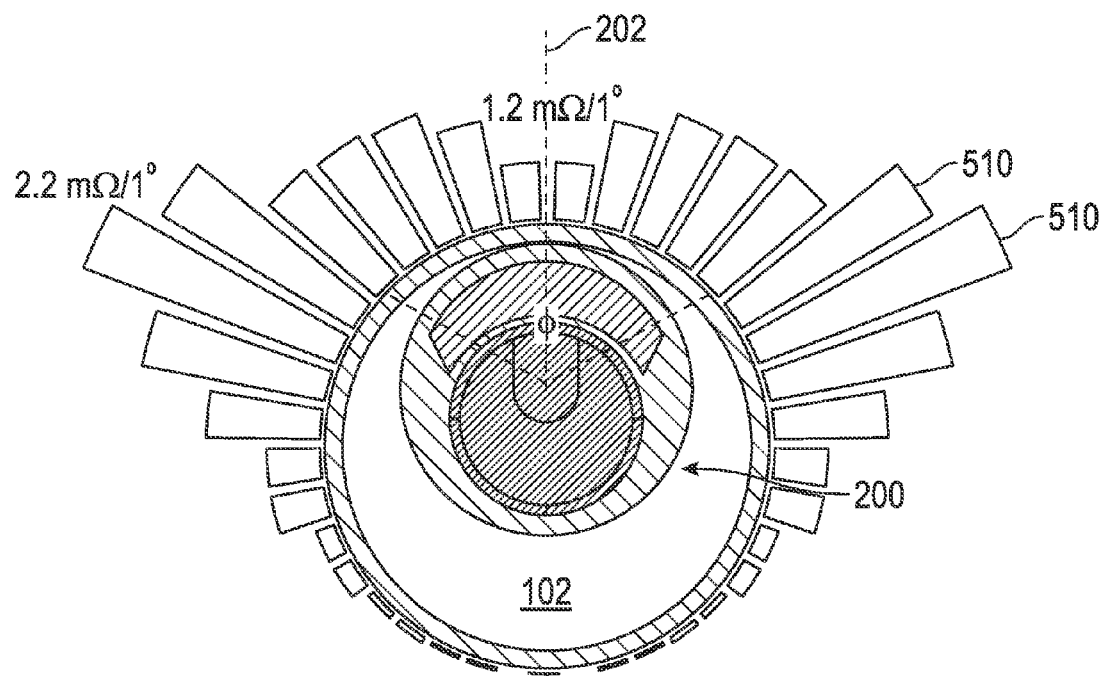
FIG. 5 depicts a cross-sectional view of the downhole tool in the wellbore, showing the amount of power absorbed by the mud around the circumference of the downhole tool, according to one or more embodiments disclosed.

FIG. 5 depicts a cross-sectional view of the downhole tool 200 in the wellbore 102 showing the amount of power absorbed by the mud around the circumference of the downhole tool 200 prior to the excluder 230 being placed around the housing 210, according to one or more embodiments disclosed. An algorithm may be used to design the shape and size of the excluder 230 (not shown in FIG. 5). The excluder 230 may be designed to reduce the electrical resistance and power absorption due to mud in the wellbore 102. The electrical resistance and power absorption may be due to eddy currents in the mud. As such, the eddy currents may be calculated around the circumference of the downhole tool 200. The power absorption may then be calculated by Equation 1 below:

$$P_{abs} = \int J \cdot E dv \quad (1)$$

where J represents eddy currents, and E represents the induced electrical field.

Figures 1, 6:
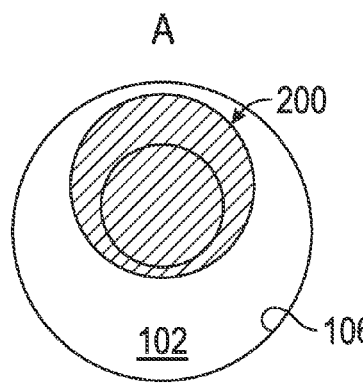
Figures 2, 6:
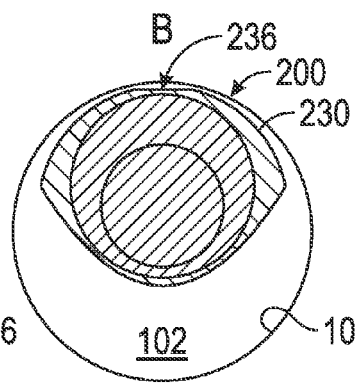
Figures 3, 6:
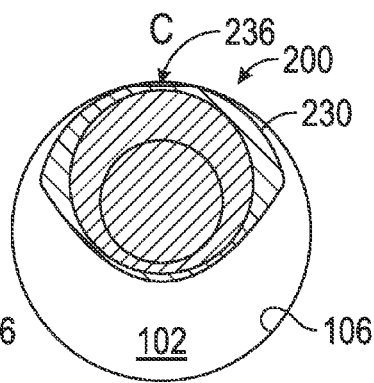
Figures 4, 6:
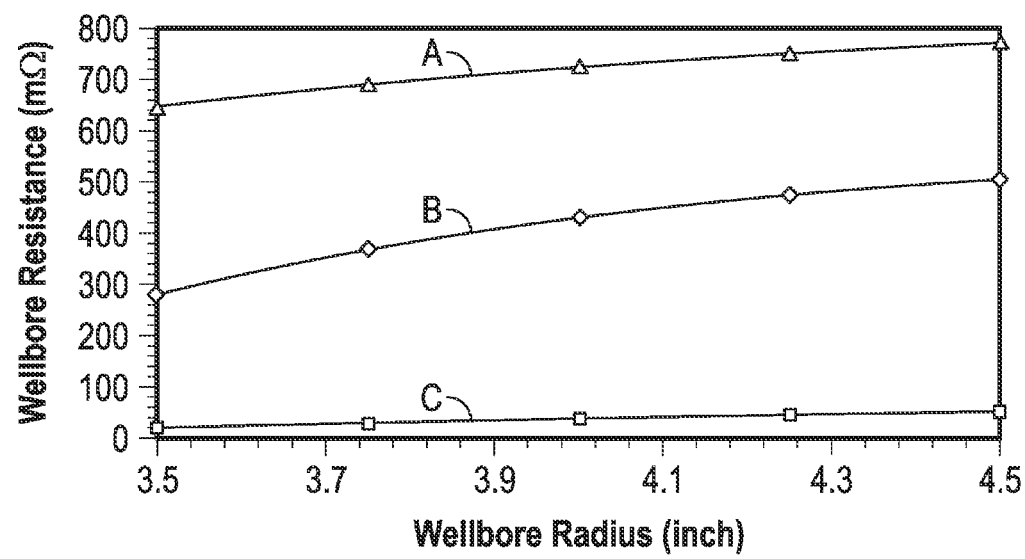

The power absorption may be seen as bars 510 in FIG. 6, where the length of the bar 510 is proportional to the power absorption at that circumferential location. The power absorption 510 shown in FIG. 6 may be greatest from about 10° to about 90° with respect to the reference axis 202 in the clockwise and counterclockwise directions. The initial shape and size of the excluder 230 may be determined based at least partially upon the measured power absorption 510 around the circumference of the downhole tool 200. The power absorption 510 may then be measured again (e.g., one or two more times) with the excluder 230 positioned around the downhole tool 200, and the shape and/or size may be modified to further reduce the power absorption 510 to the desired amount.

FIG. 6-1 depicts a first embodiment (A) of the downhole tool 200 without the excluder 230. FIG. 6-2 depicts a second embodiment (B) of the downhole tool 200 with the excluder 230 where the excluder 230 is not contacting the wall 106 of the wellbore 102. FIG. 6-3 depicts a third embodiment (C) of the downhole tool 200 with the excluder 230 where the excluder 230 is in contact with the wall 106 of the wellbore 102. FIG. 6-4 depicts an illustrative graph showing the measured electrical resistance around the downhole tool 200 for the embodiments A, B, and C.

As shown in embodiment (A), when the excluder 230 is omitted, the wellbore resistance ranges from about 640 milliohms (when the wellbore 102 has a 3.5" radius) to about 770 milliohms (when the wellbore 102 has a 4.5" radius). As shown in embodiment (B), when the excluder 230 is present, the wellbore resistance ranges from about 280 milliohms (when the wellbore 102 has a 3.5" radius) to about 500 milliohms (when the wellbore 102 has a 4.5" radius). Thus, adding the excluder 230 may decrease the wellbore resistance by a factor of about 1.5 to about 2.3. As shown in embodiment (C), when the excluder 230 is present and in contact with the wall 106 of the wellbore 102, the wellbore resistance ranges from about 20 milliohms (when the wellbore 102 has a 3.5" radius) to about 50 milliohms (when the wellbore 102 has a 4.5" radius). Thus, placing the excluder 230 in contact with the wall 106 of the wellbore 102 may decrease the wellbore resistance by a factor of about 14 to about 32.

As will be appreciated, adding the excluder 230 to the downhole tool 200 may decrease the resistance in the wellbore 102, and placing the excluder 230 in contact with the wall 106 of the wellbore 104 may decrease the resistance even further. As discussed above, the power absorption by the mud in the wellbore 102 is proportional to the wellbore resistance. Therefore, adding the excluder 230 to the downhole tool 230 and placing the excluder 230 in contact with the wall 106 of the wellbore 102 may decrease the power absorption by the mud.

As seen in embodiments (B) and (C), rather than (or in addition to) the protrusions 234 shown in FIG. 3, the outer front surface 242 of the excluder 230 may include one or more recesses 236. The recesses 236 may extend inwardly a distance from about 0.1 cm to about 1.0 cm, about 0.5 cm to about 1.5 cm, about 1 cm to about 3 cm, or more. The recesses 236 may reduce the surface area of the outer front surface 242 of the excluder 230 that is able to contact the wall 106 of the wellbore 102. This may decrease the friction or "sticking" forces between the excluder 230 and the wall 106 of the wellbore 102, thereby allowing the downhole tool 200 to be moved more easily (i.e., with less force) in the wellbore 102.

Experimentation has shown that the performance of the downhole tool 200 may be improved if the excluder 230 reduces the volume of mud immediately in front of the antenna 220 (e.g., the area between the antenna 220 and the wall 106 of the wellbore 102). For instance, one result showed that when the angle of α+β was equal to approximately 160°, power absorption by the mud was reduced by about 10% and restored antenna Q (quality factor) to within 90% in a high salinity mud wellbore 102 with a conductivity of about 96 S/m. Of course, in various embodiments, the expanse of the excluder 230 may be greater than or less than 160°.

While the specific embodiments described above have been shown by way of example, it will be appreciated that many modifications and other embodiments will come to the mind of one skilled in the art having the benefit of the teachings presented in the foregoing description and the associated drawings. Accordingly, it is understood that various modifications and embodiments are intended to be included within the scope of the appended claims.

What is claimed is:

1. A downhole tool, comprising,
a cylindrical housing;
a magnet positioned within the housing;

an antenna positioned within the housing; and an excluder positioned around the housing, wherein a thickness of the excluder varies around the housing, wherein the thickness of the excluder increases through a first angle with respect to an axis that extends from a central longitudinal axis of the housing through a center of the antenna, wherein the first angle is from about 10° to about 120°.

2. The downhole tool of claim 1, wherein the antenna emits radiofrequency electromagnetic pulses of energy.

3. The downhole tool of claim 1, wherein the first angle is measured in a clockwise direction with respect to the axis.

4. The downhole tool of claim 3, wherein the thickness of the excluder increases through a second angle from about 10° to about 120° with respect to the axis, and wherein the second angle is measured in a counterclockwise direction with respect to the axis.

5. The downhole tool of claim 3, wherein the thickness of the excluder decreases through a second angle with respect to the axis, wherein a sum of the first and second angles is 180°, and wherein the second angle is measured in the clockwise direction with respect to the axis.

6. The downhole tool of claim 1, wherein an outer surface of the excluder comprises a protrusion, a recess, or both.

7. The downhole tool of claim 1, wherein a cross-sectional shape of the excluder is an oval, a prolate spheroid, a football, or a combination thereof.

8. A downhole tool, comprising,
a housing;
a magnet positioned within the housing;
an antenna positioned within the housing; and
an excluder positioned around the housing, wherein a distance between a central longitudinal axis of the housing and an outer surface of the excluder is less at a first angle than at a second angle, and wherein the first and second angles are measured with respect to an axis that extends from the central longitudinal axis through a center of the antenna, wherein the excluder comprises a first layer made of plastic, and a second layer positioned around the first layer that is made of fiberglass.

9. The downhole tool of claim 8, wherein the first angle is at 0° with respect to the axis, and the second angle is from about 10° to about 120° with respect to the axis.

10. The downhole tool of claim 9, wherein the distance is greater at the second angle than at a third angle, wherein the third angle is 180° from the first angle.

11. The downhole tool of claim 10, wherein an outer surface of the excluder comprises a protrusion, a recess, or both.

12. A method for measuring properties of a formation surrounding a wellbore, comprising:
running a downhole tool into the wellbore, the downhole tool comprising:
a substantially cylindrical housing;
a magnet positioned within the housing;
an antenna positioned within the housing; and
an excluder positioned around the housing, wherein a thickness of the excluder varies around the housing; and
positioning the downhole tool such that an outer surface of the excluder is in contact with a wall of the wellbore, wherein the thickness of the excluder increases through a first angle with respect to an axis that extends from a central longitudinal axis of the housing through a center of the antenna, and wherein the first angle is from about 10° to about 120°.

13. The method of claim 12, further comprising emitting radiofrequency electromagnetic pulses of energy from the antenna into the formation.

14. The method of claim 13, wherein at least a portion of the outer surface of the excluder has a radius that is substantially equal to a radius of the wellbore.

15. The method of claim 12, wherein the thickness of the excluder decreases through a second angle with respect to the axis, wherein a sum of the first and second angles is 180°, and wherein the second angle is measured in the clockwise direction with respect to the axis.

* * * * *